United States Patent [19]

Farassat

[11] Patent Number: 5,018,658
[45] Date of Patent: May 28, 1991

[54] BONDING WEDGE

[75] Inventor: Farhad Farassat, Muenchen, Fed. Rep. of Germany

[73] Assignee: Dynapert Inc., Wilmington, Del.

[21] Appl. No.: 509,555

[22] Filed: Apr. 12, 1990

[30] Foreign Application Priority Data

Apr. 17, 1989 [DE] Fed. Rep. of Germany ....... 3912580

[51] Int. Cl.⁵ .................. B23K 3/00; H01L 21/60
[52] U.S. Cl. .................... 228/4.5; 228/15.1
[58] Field of Search ........... 228/1.1, 4.5, 110, 111, 228/179, 904, 15.1

[56] References Cited

U.S. PATENT DOCUMENTS 3,627,192  12/1971  Killingsworth ............... 228/4.5
3,986,653  10/1976  Gilding ......................... 228/4.5

FOREIGN PATENT DOCUMENTS 20340    1/1987  Japan ............................ 228/1.1
115734   5/1987  Japan ............................ 228/4.5
94641    4/1988  Japan ............................ 228/4.5

Primary Examiner—Samuel M. Heinrich
Attorney, Agent, or Firm—Spencer T. Smith

[57] ABSTRACT

A bonding wedge (1) for an ultrasonic bonder, in particular an aluminium thick wire bonder, with a wire guide in the form of a through-passage (3) extending in the wire direction obliquely from above to the pressing face (2). A plastics sleeve (11) through which the bonding wire (4) is guided is introduced in the through-passage (3) to reduce significantly the frictional resistance of the bonding wire (4) in the region of the through-passage (3) and to reduce significantly the abrasion of aluminium.

4 Claims, 1 Drawing Sheet

U.S. Patent  May 28, 1991  5,018,658
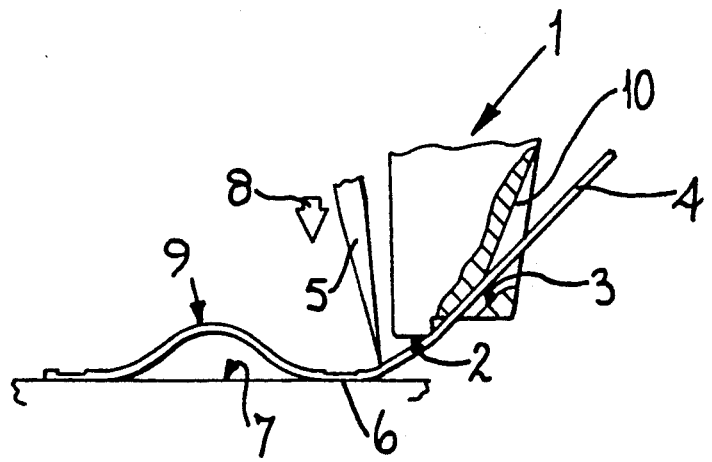
Fig_1 PRIOR ART
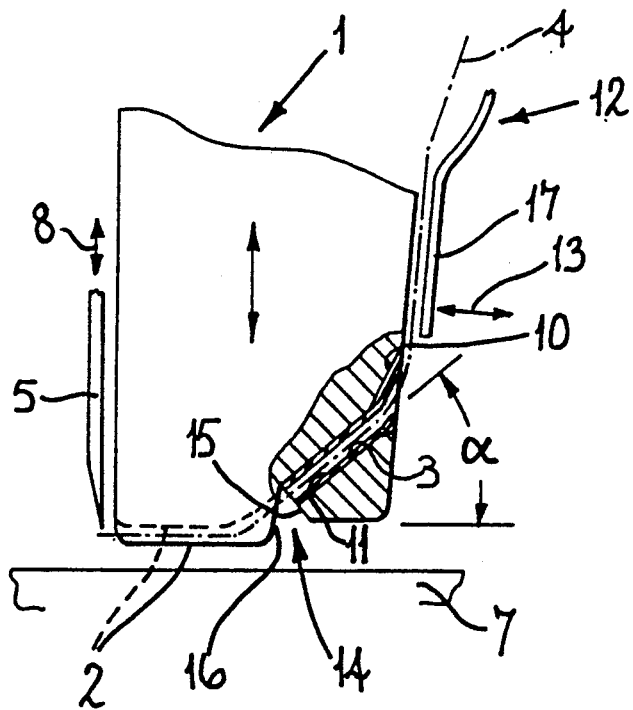
Fig_2

BONDING WEDGE

BACKGROUND OF THE INVENTION

The invention relates to a bonding wedge for an ultrasonic bonder, in particular an aluminium thick wire bonder, with a wire guide in the form of a through-passage extending in the direction of the wire obliquely from above to the pressing face.

An electrically conductive wire can be pushed by means of such bonding wedges against a contact face of an electric or electronic component, with ultrasonic excitation, to produce a corresponding electrical connection between the wire and the contact face. The bonding wedge is connected to a so-called ultrasonic transducer which is in turn part of a reciprocating bonding head. A wire coil from which the bonding wire can be removed and a wire clip by means of which the bonding wire can be clamped during formation of the first bond and after formation of a so-called loop and a second bond are further essential parts of the bonding head.

When using bonding wedges with a wire guide in conjunction with aluminium wire, the relatively high frictional resistance as well as the abrasion of the aluminium wire in the region of the wire guide have been found to be extremely disadvantageous, with the result that loop formation is detrimentally affected even after a relatively short operating time. For this reason, the bonding wedges frequently have to be dismantled and cleaned of aluminium deposits, causing interruptions to operation. Moreover, the aluminium deposits in the region of the wire guide can also be entrained by the bonding wire and come into contact with the pressing face of the bonding wedge, resulting in the formation of inadequate bonds or contacts.

It is an object of the present invention to provide a bonding wedge of the type with a wire guide in which the above-mentioned disadvantages are reduced or substantially avoided, i.e. the frictional resistance of the aluminium wire and the abrasion thereof in the region of the wire guide are reduced to a minimum.

BRIEF SUMMARY OF THE INVENTION

The invention provides a bonding wedge for an ultrasonic bonder, with a wire guide in the form of a through-passage extending in the wire direction obliquely from above to the pressing face, characterised in that a plastics sleeve is fitted in the through-passage, through which sleeve the bonding wire is guided.

The plastics sleeve preferably extends over the entire length of the through-passage forming the wire guide, so that the plastics sleeve is also effective in the critical wire deflection regions of the wire guide, it is possible to supply the bonding wire at an angle of about 90° to the pressing face of the wedge. This in turn has the result that the bonding wedge including the wire supply means can be extremely thin in construction in the lower portion or in the portion facing the bonding point, in particular in the lower half, at least in the lower third, even if it is extremely long, so the bonding wedge can be used particularly effectively for bonding in extremely tight positions, for example in the corner region of a housing.

The friction-reducing and abrasion-reducing guide sleeve is preferably composed of carbon tetrafluoride (Teflon=registered trademark), polyethylene or polyamide. The internal diameter of the plastics sleeve is preferably between 0.2 and 0.8 mm, depending on the wire diameter selected which is of the order of 100 to 700 μm. The external diameter of the sleeve is preferably from 0.4 to 1.0 mm. Using the plastics sleeve according to the invention, the angle of inclination between the wire guide and the pressing face is not critical, and is preferably between 20° and 80°, more preferably 50° to 70°, most preferably about 60°.

The bonding wedge preferably further comprises a wire clip and a wire cutter, the cutter acting on the side of the wedge remote from the wire clip. The wire clip is preferably bent towards the wedge in the lower portion, so that the lower portion extends substantially parallel to the wedge. The provision of a wire cutter and wire clip is particularly advantageous in conjunction with a bonding head according to DE-A-35 19 594.

BRIEF DESCRIPTION OF THE DRAWINGS

An embodiment of a bonding wedge constructed according to the invention is described in more detail below in comparison with the prior art with reference to the accompanying drawings.

FIG. 1 shows a bonding wedge of a conventional type in side view, partially in section.

FIG. 2 shows a bonding wedge constructed according to the invention in similar view to that in FIG. 1.

DETAILED DESCRIPTION

FIG. 1 shows a bonding wedge 1 for an ultrasonic bonder, in particular aluminium thick wire bonder, of conventional design. This bonding wedge has a wire guide extending in the wire direction obliquely from above to the pressing face 2, in the form of a through-passage 3 through which the bonding wire 4 is guided to the pressing face 2 of the wedge 1. On the side of the bonding wedge 1 remote from the bonding wire supply means, there is arranged a bonding wire cutter 5 which acts in the direction of the arrow 8 to sever the bonding wire after production of a loop 9 and a second bond 6 on the contact face of an electronic component 7.

The through-passage 3 has, at the wire inlet, a wire inlet funnel 10 which is open, in particular, toward the top to allow steeper introduction of the wire on the wire supply side. Despite this measure, however, considerable aluminium wire abrasion cannot be avoided in the region of the through-passage 3, and, in particular, in the region of the transition between the through-passage 3 and the inlet funnel 10 when bonding with aluminium wire, which is also a sign of increased frictional resistance between the aluminium wire 4 and the wire guide. As the abrasion increases, so does the frictional resistance between wire 4 and wire guide, adversely affecting loop formation. There is also a risk that abraded particles of aluminium wire will be entrained into the region of the pressing face 2 as the aluminium wire 4 continues to be pulled. This can result in inadequate bonds. These disadvantages were accepted in the past and the wedge 1 had to be dismantled and cleaned after relatively short operating periods, giving rise to a corresponding interruption in operation.

In the bonding wedge constructed according to the invention, as shown in FIG. 2, a sleeve 11 of a material which gives a significant reduction in the frictional resistance with the aluminium wire 4 is fitted into the through-passage 3. The sleeve 11 is preferably composed of plastics material, in particular carbon tetrafluoride (Teflon=registered trademark) or polyethylene.

Abraded particles of aluminium are no longer detected when these materials are used. As shown in FIG. 2, the plastics sleeve 11 extends over the entire length of the through-passage 3, i.e. including inlet funnel 10 which can be smaller in size than in the prior art. Because of the plastics sleeve 11, the angle of deflection of the aluminium wire 4 on the wire supply side is no longer critical. In particular, the construction illustrated allows a wire supply at an angle of about 90° to the pressing face 2 or contact face. The wire can therefore be supplied above the inlet funnel 10 along the lateral boundary face of the wedge 1 or in contact therewith. Consequently, a wire clip 12 which co-operates with the wedge 1 and is movable in the direction of the double arrow 13 to clamp the wire 4 on the wedge 1 or release the wire 4 is also arranged above the inlet funnel 10. The wire cutter 5 already explained with reference to FIG. 1 is arranged on the side of the wedge 1 remote from the wire clip 12. FIG. 2 shows that in the lower region or in the region facing the contact face the wedge 1, together with the wire cutter 5 and wire clip 12 attachments, can be constructed extremely thinly, so that the bonding tool described is particularly suitable for use on less readily accessible contact faces, for example in the corner region of housings. In a known manner, the bonding wedge 1 according to FIG. 2 has a, for example, roughly V-shaped notch 14 between the pressing face 2 and the through-passage 3, the limiting face 15 of the V-shaped notch 14 remote from the pressing face 2 intersecting the through-passage 3 roughly at right angles. The V-shaped notch 14 is dimensioned such that the plastics sleeve 3 rests on the face 16 of the V-shaped notch 14 adjacent to the pressing face 2. A stop for the plastics sleeve 11 on the interior of the wedge is provided in this way. There is no risk of the plastics sleeve 11 falling from the through-passage 3 on the side of the inlet funnel 10 as the plastics sleeve 11 is invariably forced or pushed by the entrained wire 4 toward the pressing face 2 during operation.

The internal diameter of the plastics sleeve 11 is between about 0.2 and 0.8 mm, depending on the selected wire diameter of about 100 to 700 $\mu$m. The external diameter of the plastics sleeve 11 is about 0.4 to 1.0 mm, i.e. the wall thickness of the plastics sleeve 11 is about 200 $\mu$m. It has been found that this small wall thickness is sufficient for the plastics sleeve 11 to ensure continuous operation while affording the above-mentioned advantages. It should be borne in mind that the dimensions of the wedge 1 are in any case very small so that a plastics sleeve having suitably small dimensions must be used. In the past, it was impossible to imagine how such small-dimensioned sleeves could be produced for this purpose. The described measure is also surprising in this respect.

The angle of inclination alpha between the through-passage 3 and the pressing face 2 is between about 20° and 80°, in particular 50° to 70°, preferably about 60°. Because of the advantageous effect of the plastics sleeve 11, the angle of inclination alpha is not critical.

Moreover, it should also be mentioned with respect to the wire clip 12 that, according to FIG. 2, this wire clip 12 is bent in its lower portion 17 toward the wedge 1 in such a way that the lower portion 17 extends substantially parallel to the wedge 1. This contributes to the narrow construction of the wedge 1 in the lower region.

The plastics sleeve 11 can also be guided slightly beyond the inlet funnel 10. Any contact between wedge and wire can therefore be avoided, unless such contact in the region of the clip 17 is desired.

The pressing face 2 is also constructed in the conventional way, i.e. it preferably has an approximately V-shaped or C-shaped contour in the direction transverse to the wire 4.

In an alternative construction, the V-shaped notch 14 in the bonding wedge may be replaced by a U-shaped notch.

The mode of operation of the wedge 1 is summarised as follows:

Production of the first bond

Wire clip 12 in the open position,
The bonding head is lowered onto first bonding point,
Ultrasonic excitation of the wedge 1 via the transducer (not shown),
Wire clip 12 on,
Formation of the loop 9 while lowering the bonding head to produce a second bond.

Production of the second bond

After lowering the bonding head onto the second bonding point, ultrasonic excitation of the wedge 1,
The bonding head, together with the wedge 1, is raised and is moved on in the wire or bonding direction,
Wire clip 12 in the closed position,
The wire cutter 5 is activated in the direction of the arrow 8 to sever the bonding wire 4,
The bonding head together with the wedge 1 is moved back in the bond direction and then into a position above the first bonding point,
The bonding head together with the wedge 1 is raised into the starting position.

I claim:

1. A bonding wedge for an ultrasonic bonder comprising
   a wire guide in the form of a through-passage extending obliquely downwardly in the wire direction,
   a plastic sleeve slidably located within said through-passage and extending substantially the entire length thereof, and
   means for preventing the downward displacement of said plastic sleeve.

2. A bonding wedge according to claim 1 wherein said bonding wedge includes
   a pressing face, and
   a V shaped notch between said pressing face and the bottom of said wire guide,
   the side of said notch remote from said wire guide comprising said preventing means.

3. A bonding wedge according to claim 2, wherein said preventing means prevents the down ward displacement of the bottom of said plastic sleeve beyond the bottom of said passage.

4. A bonding wedge according to claim 1, further comprising means for vertically guiding wire to the top of said through passage including clip means establishing with the rear face of said bonding wedge a vertical clearance through which wire will be advanced.

* * * * *